United States Patent
Lee et al.

(10) Patent No.: US 12,438,029 B2
(45) Date of Patent: Oct. 7, 2025

(54) VARIABLE CAPACITANCE DEVICE, SUBSTRATE PROCESSING APPARATUS INCLUDING THE VARIABLE CAPACITANCE DEVICE, AND SUBSTRATE PROCESSING METHOD

(71) Applicant: SEMES CO., LTD., Chungcheongnam-do (KR)

(72) Inventors: Jong Gun Lee, Chungcheongnam-do (KR); Hyung Joon Kim, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 198 days.

(21) Appl. No.: 18/088,753

(22) Filed: Dec. 26, 2022

(65) Prior Publication Data
US 2024/0038566 A1    Feb. 1, 2024

(30) Foreign Application Priority Data

Jul. 29, 2022   (KR) .......................... 10-2022-0094775

(51) Int. Cl.
H01L 21/683    (2006.01)
(52) U.S. Cl.
CPC ............................... H01L 21/6833 (2013.01)
(58) Field of Classification Search
CPC ... H01L 21/683; H01L 21/6833; H02N 13/00; H01J 37/32183; H01J 37/32568; H01J 37/32642; H01J 37/32715; H01J 37/32174; H01J 2237/334; H01G 5/16
USPC ........................................................ 361/234
See application file for complete search history.

(56) References Cited

U.S. PATENT DOCUMENTS

| | | | |
|---|---|---|---|
| 9,076,636 B2 | 7/2015 | Ohata et al. | |
| 10,020,172 B2 | 7/2018 | Ohata et al. | |
| 11,651,991 B2* | 5/2023 | Matyushkin | ........ H01L 21/6833 361/234 |
| 2003/0029569 A1* | 2/2003 | Natsuhara | ........... C23C 16/4586 156/345.43 |
| 2009/0242135 A1* | 10/2009 | Koshimizu | ....... H01J 37/32091 156/345.48 |
| 2018/0012784 A1* | 1/2018 | Eto | .................... H01J 37/32082 |

FOREIGN PATENT DOCUMENTS

| | | |
|---|---|---|
| JP | 2012-64671 | 3/2012 |
| KR | 10-2005-0050660 | 5/2005 |
| KR | 10-2111504 | 5/2020 |
| KR | 10-2344528 | 12/2021 |

OTHER PUBLICATIONS

Office Action dated Jan. 13, 2025 for Korean Patent Application No. 10-2022-0094775 and its English translation by Google Translate.

* cited by examiner

*Primary Examiner* — Danny Nguyen
(74) *Attorney, Agent, or Firm* — WOMBLE BOND DICKINSON (US) LLP

(57) ABSTRACT

A substrate processing apparatus is provided. The substrate processing apparatus includes: a chuck member; a ceramic puck disposed on the chuck member; a focus ring disposed to surround the ceramic puck; an insulating layer disposed below the focus ring to surround the chuck member; and two electrodes formed in the insulating layer, wherein a distance between the two electrodes is adjustable to form a variable capacitance.

17 Claims, 8 Drawing Sheets

[FIG. 1]
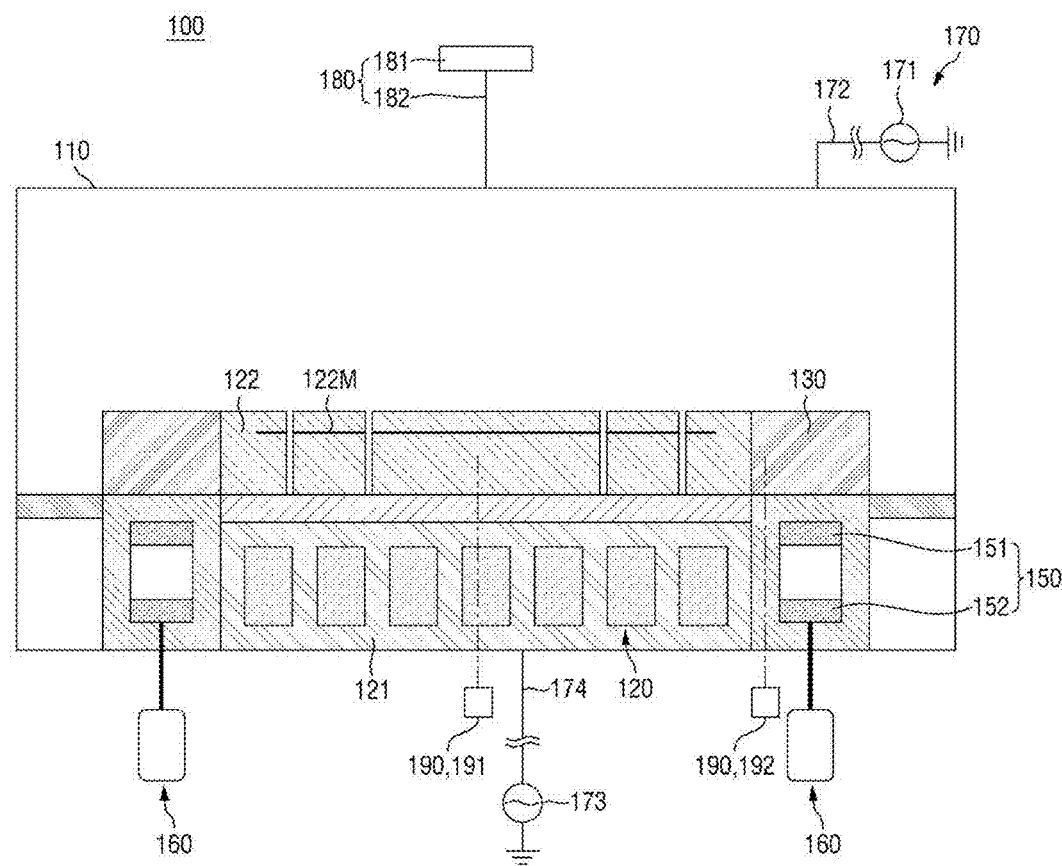

[FIG. 2]
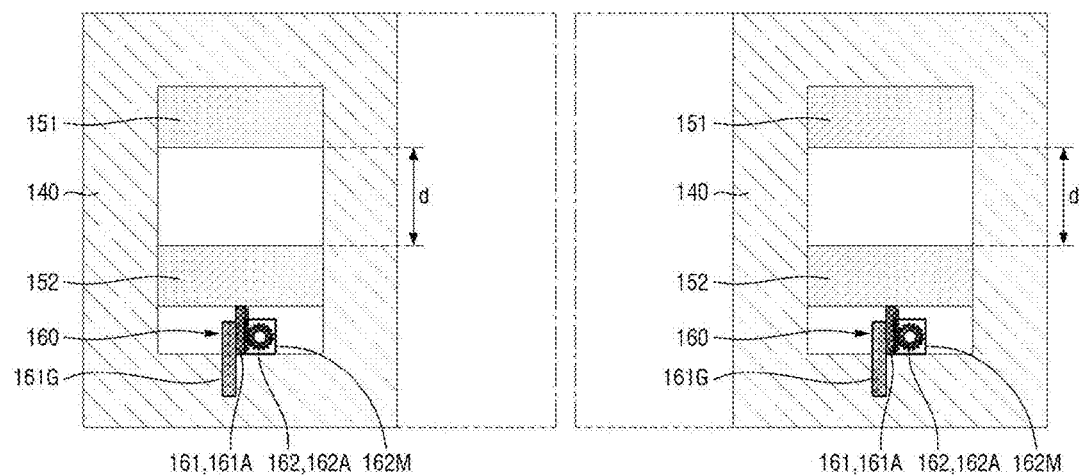

[FIG. 3]
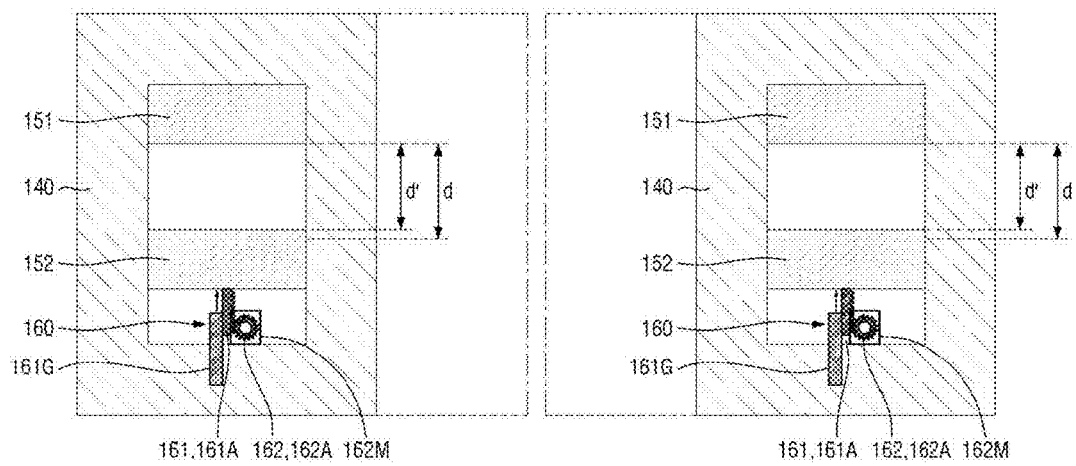

[FIG. 4]
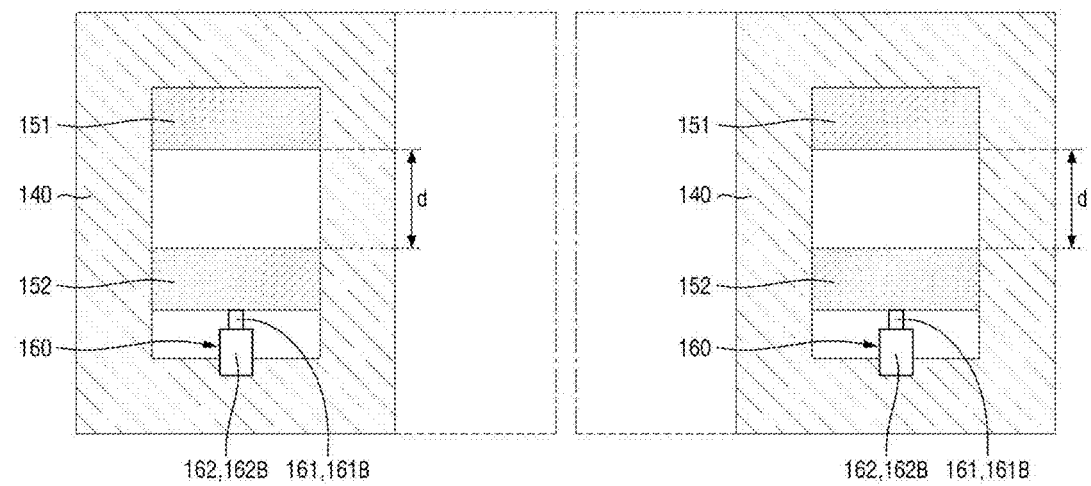

[FIG. 5]
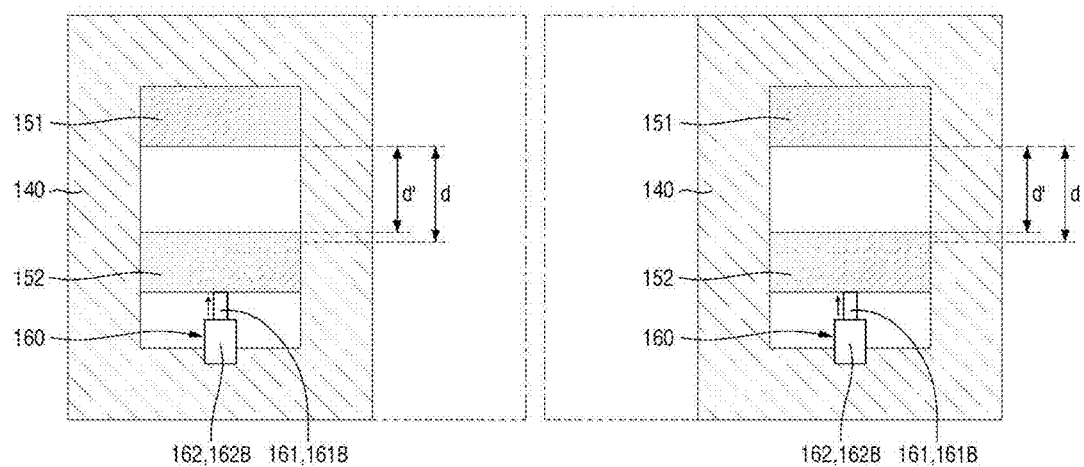

[FIG. 6]
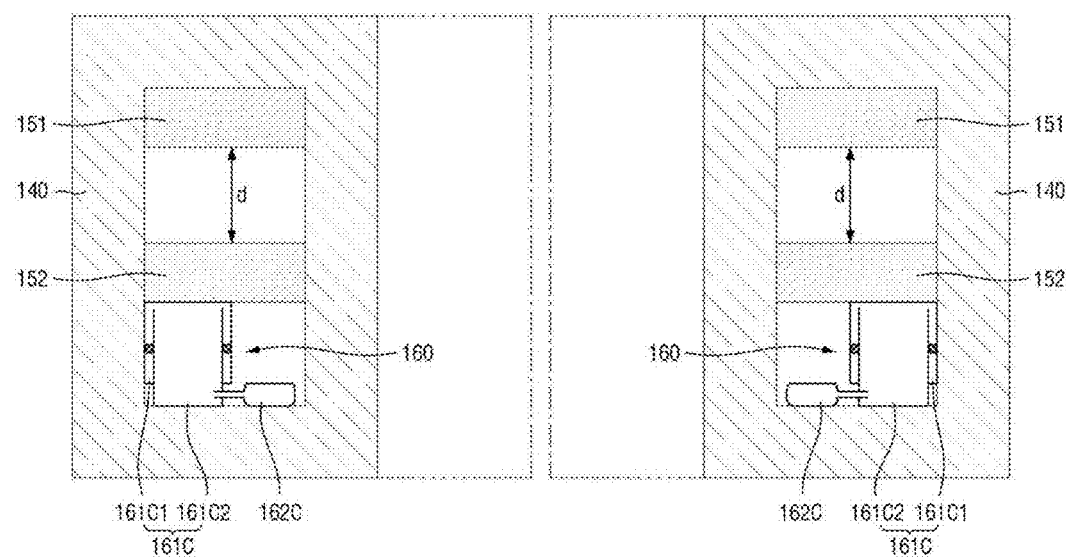

[FIG. 7]
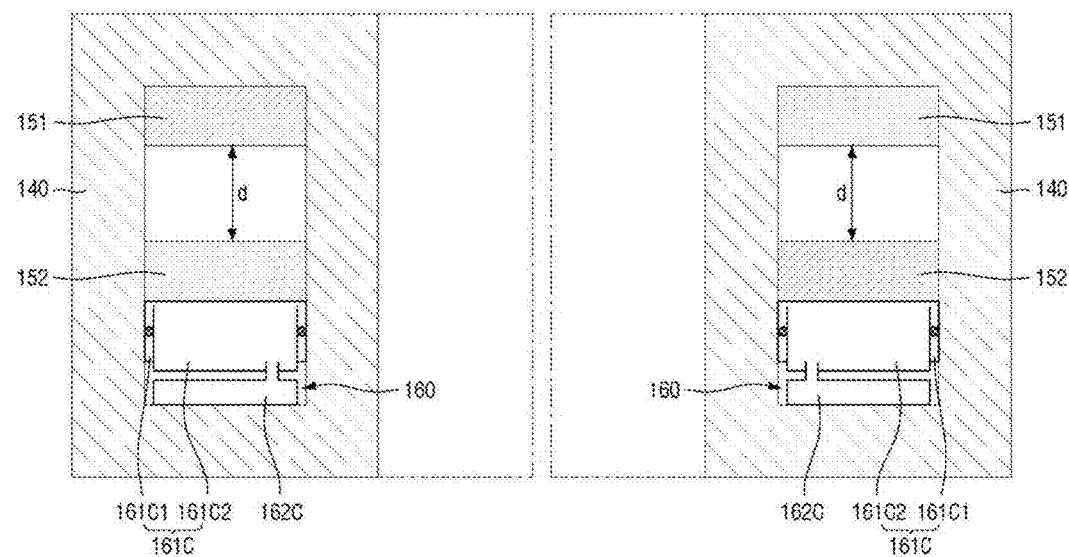

[FIG. 8]
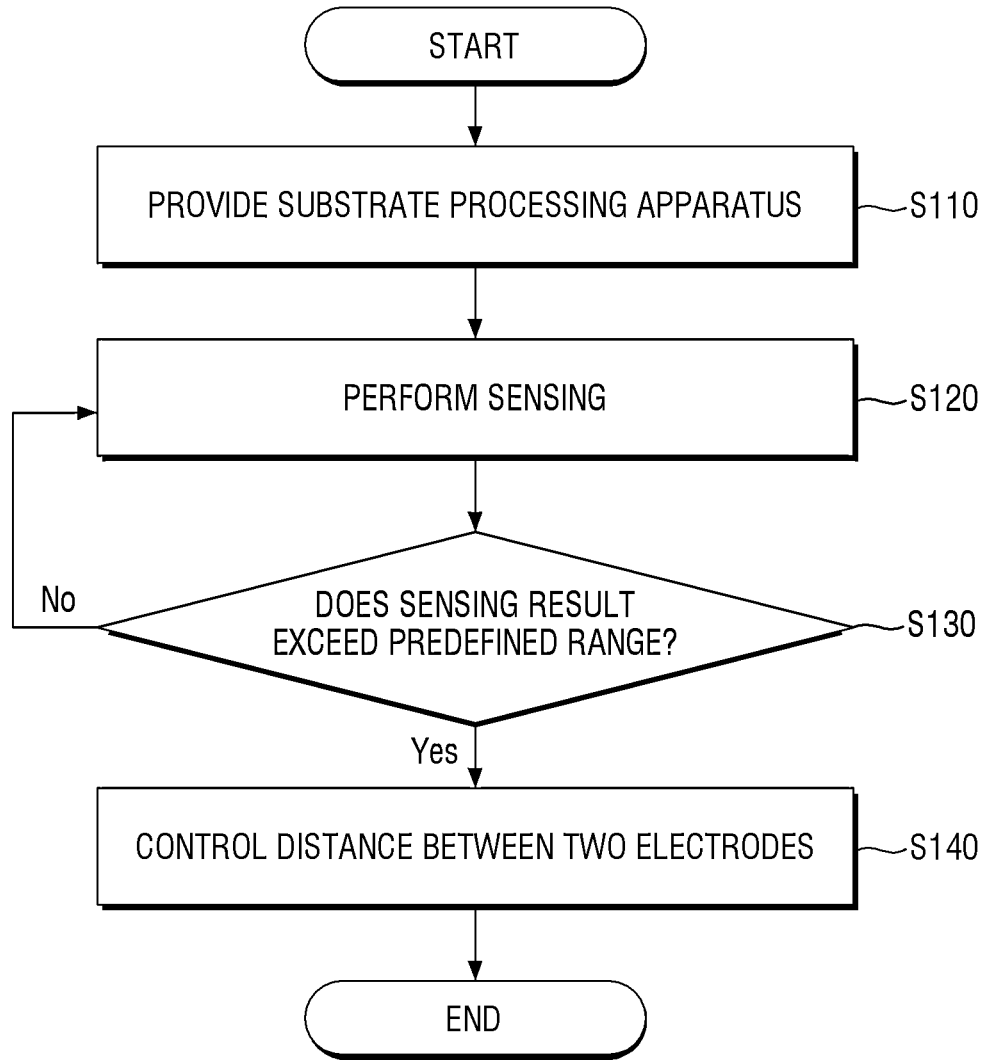

VARIABLE CAPACITANCE DEVICE, SUBSTRATE PROCESSING APPARATUS INCLUDING THE VARIABLE CAPACITANCE DEVICE, AND SUBSTRATE PROCESSING METHOD

CROSS-REFERENCE TO RELATED APPLICATION

This application claims priority from Korean Patent Application No 10-2022-0094775 filed on Jul. 29, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a variable capacitance device, a substrate processing apparatus including the variable capacitance device, and a substrate processing method.

2. Description of the Related Art

In order to fabricate a semiconductor device, a desired pattern is formed on a substrate by performing a variety of processes such as photolithography, etching, ashing, ion implantation, thin film deposition, and rinsing. Here, etching is a process of removing a selected part of a film formed on a substrate, and wet etching and dry etching are used.

An etching apparatus using plasma is used to perform dry etching. To form plasma, an electromagnetic field is formed in a chamber. The electromagnetic field excites a processing gas provided in the chamber, into a plasma state.

Plasma refers to a state of ionized gas composed of ions, electrons, radicals, and the like and is generated by very high temperature, strong electric fields, or radio frequency (RF) electromagnetic fields. The fabrication of a semiconductor device involves performing an etching process using plasma. Specifically, the etching process is performed by colliding the ion particles contained in the plasma with a substrate.

The density of plasma for an etching process needs to be uniform within a chamber by as much as the size of a wafer or a substrate to achieve equipment performance for the design for the fabrication of a semiconductor device. However, a focus ring of a substrate processing apparatus is disposed along the edge of the substrate, and as the substrate and the focus ring have different heights and different materials, imbalances in the density of plasm may occur. Thus, even when the focus ring is provided inside the chamber to uniformize the density of plasma, the focus ring may be etched during an etching process so that the height and the shape of the focus ring may be deformed, affecting the result of the processing of the substrate. As the etching process progresses, not only the substrate, but also the focus ring is etched over the course of the etching process. Thus, the performance of the equipment may be changed, affecting the result of the processing of the substrate. Therefore, an improvement is needed.

SUMMARY

Aspects of the present disclosure provide a variable capacitance device, a substrate processing apparatus including the variable capacitance device, and a substrate processing method, which are capable of improving imbalances in the density of plasma that may affect the result of substrate processing, even if a focus ring is etched so that the height and the shape of the focus ring change.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate processing apparatus includes: a chuck member; a ceramic puck disposed on the chuck member; a focus ring disposed to surround the ceramic puck; an insulating layer disposed below the focus ring to surround the chuck member; and two electrodes formed in the insulating layer, wherein a distance between the two electrodes is adjustable to form a variable capacitance.

According to another aspect of the present disclosure, a variable capacitance device includes: an insulating layer disposed below a focus ring, in a chamber, to surround a chuck member; two electrodes formed in the insulating layer, wherein a distance between the two electrodes is adjustable to form a variable capacitance; a distance control unit including a support member, which supports the electrodes and an upper end position of which is variable, and a driving member, which controls a height or volume of the support member to change the upper end position of the support member, the distance control unit controlling the distance between the two electrodes; and a sensor unit provided in the chamber and sensing an electrical property of a first periphery, which is around a ceramic puck, and an electrical property of a second periphery, which is around the focus ring, wherein the distance control unit controls the height of the support member such that the electrical property of the second periphery becomes similar to the electrical property of the first periphery.

According to another aspect of the present disclosure, a substrate processing method includes: providing a substrate processing apparatus including a chuck member, a chuck member, a ceramic puck, which is disposed on the chuck member, a focus ring, which is disposed to surround the ceramic puck, an insulating layer, which is disposed below the focus ring to surround the chuck member, two electrodes, which are formed in the insulating layer and a distance between which is adjustable to form a variable capacitance, and a sensor unit, which is provided in a chamber where the chuck member is provided and senses an electrical property in the chamber; sensing, by the sensor unit, an electrical property of a first periphery, which is around the ceramic puck, and an electrical property of a second periphery, which is around the focus ring; and controlling the distance between the two electrodes such that the electrical properties of the first and second peripheries become similar to each other.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 1 illustrates a substrate processing apparatus in which a variable capacitance device according to some embodiments of the present disclosure is provided;

FIG. 2 illustrates the inside of an insulating layer of a substrate processing apparatus according to a first embodiment of the present disclosure;

FIG. 3 illustrates how to change the distance between electrodes of FIG. 2;

FIG. 4 illustrates the inside of an insulating layer of a substrate processing apparatus according to a second embodiment of the present disclosure;

FIG. 5 illustrates how to change the distance between electrodes of FIG. 4;

FIG. 6 illustrates the inside of an insulating layer of a substrate processing apparatus according to a third embodiment of the present disclosure;

FIG. 7 illustrates the inside of an insulating layer of a substrate processing apparatus according to a fourth embodiment of the present disclosure; and FIG. 8 is a flowchart illustrating a substrate processing method according to some embodiments of the present disclosure.

DETAILED DESCRIPTION

Embodiments of the present disclosure will hereinafter be described with reference to the accompanying drawings. The advantages and features of the present invention and the manner of achieving them will become apparent with reference to the embodiments described in detail below with reference to the accompanying drawings. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

The terminology used herein is for the purpose of illustrating embodiments and is not intended to be limiting of the present invention. In the present specification, the singular form includes plural forms unless otherwise specified in the specification. As used herein, the terms "comprises" and/or "comprising" means that a component, step, operation, and/or element may be embodied in one or more other components, steps, operations, and/or elements and does not exclude the presence or addition of other components, steps, operations, and/or elements.

In the description that follows, the term "first periphery" refers to a region around a ceramic puck (where the middle of a substrate resides), and the term "second periphery" refers to a region around a focus ring adjacent to the edge of the substrate.

FIG. 1 illustrates a substrate processing apparatus in which a variable capacitance device according to some embodiments of the present disclosure is provided, FIG. 2 illustrates the inside of an insulating layer of a substrate processing apparatus according to a first embodiment of the present disclosure, and FIG. 3 illustrates how to change the distance between electrodes of FIG. 2.

Referring to FIGS. 1 through 3, a substrate processing apparatus 100 may include a chamber 110, a substrate support unit 120, a focus ring 130, an insulating layer 140, two electrodes 150, a distance control unit 160, a plasma generation unit 170, a gas supply unit 180, and a sensor unit 190.

The substrate processing apparatus 100 may process a substrate (or a wafer) via an etching process (e.g., a dry etching process) in a vacuum environment. The substrate processing apparatus 100 may process the substrate with the use of, for example, a plasma process.

The chamber 110 may provide space in which a plasma process is performed. The chamber 110 may include an exhaust hole (not illustrated) at a lower part thereof. The exhaust hole may be connected to an exhaust line (not illustrated) mounted on a pump (not illustrated). The exhaust hole may discharge reaction byproducts generated during a plasma process and gases remaining in the chamber 110 to the outside of the chamber 110. Then, the inside of the chamber 110 may be decompressed to a predetermined pressure level.

An opening (not illustrated) may be formed on a sidewall of the chamber 110. The opening may be a passage through which the substrate enters and exits the chamber 110. A door assembly (not illustrated) for opening or closing the chamber 110 may be provided in the opening.

The substrate support unit 120 may be installed in the chamber 110, at the lower part of the chamber 110. The substrate support unit 120 may be implemented as an electrostatic chuck (ESC) and may support the substrate with an electrostatic force.

The substrate support unit 120 may include a chuck member 121 and a ceramic puck 122.

The chuck member 121 may support the ceramic puck 122. The chuck member 121 may be formed of, for example, an aluminum (Al) material. A cooling member (not illustrated) may be provided in the chuck member 121. The cooling member may be provided to a cooling line where a coolant flows. The cooling member may allow, together with a heating member that will be described later, the processing temperature of the substrate to be maintained while an etching process is being performed in the chamber 110.

The ceramic puck 122 may support the substrate mounted thereon, with the use of an electrostatic force. The ceramic puck 122 may be formed of a ceramic material, and an electrode layer 122M may be formed in the ceramic puck 122 to generate an electrostatic force. A plurality of holes may be provided in the ceramic puck 122, and a helium gas may move through the holes.

The heating member may be provided in the ceramic puck 122. The heating member may be provided as heating wires and may allow, together with the cooling member in the chuck member 121, the processing temperature of the substrate to be maintained.

A bonding layer (not illustrated) may be formed between the chuck member 121 and the ceramic puck 122 so that the ceramic puck 122 may be fixed onto the chuck member 121.

The focus ring 130 may be provided in the form of a ring and may be disposed to surround the ceramic puck 122. The focus ring 130 may support the edge of the substrate and may focus plasma to the substrate.

A baffle (not illustrated) may be installed between the insulating layer 140 and the inner sidewalls of the chamber 110. The baffle may exhaust the byproducts of a plasma process or any unreacted gases.

The insulating layer 140 may be provided as a ring-shaped dielectric substance and may be disposed below the focus ring 130 to surround the chuck member 121. Referring to FIG. 2, the insulating layer 140 may have space formed therein.

Two electrodes 150 may be provided in the insulating layer 140. For example, the space in the insulating layer 140 may have a closed structure so that polymers generated in the chamber 110 are not deposited on the electrodes 150, which are provided in the insulating layer 140.

Alternatively, a lower part of the insulating layer 140 may be open. In other words, the upper part and the circumferential surface of the insulating layer 140 may not be exposed. In a case where the lower part of the insulating layer 140 is open, a cover (not illustrated) for opening and closing the lower part of the insulating layer 140 may be provided. That is, various modifications may be made to the insulating layer 140 so that no polymers are deposited on the electrodes 150.

The electrodes 150 may be formed of a metal material. The electrodes 150 may have the same shape as the space in the insulating layer 140 or may have a ring-like shape. The distance between the electrodes 150 may be controlled to form a variable capacitance.

As capacitance is controlled by adjusting the distance between the electrodes 150 in the chamber 110, particularly, inside the insulating layer 140 below the focus ring 130, which supports the edge of the substrate, power lines can be reduced, as compared to the case of performing impedance control outside the chamber 110, and as a result, the loss rate and stability of power lines can be improved.

For example, the electrodes 150 may include first and second electrodes 151 and 152. The first electrode 151 may be positioned in an upper part of the insulating layer 140. The second electrode 152 may be provided below the first electrode member 151 and may be vertically movable. In other words, the distance between the first and second electrodes 151 and 152 may be controlled to form a variable capacitance. For example, the second electrode member 152 may be vertically moved to form a variable capacitance.

The second electrode 152 may be vertically moved by the distance control unit 160 to form a variable capacitance.

The distance control unit 160 is an element for controlling the distance between the electrodes 150. If the result of sensing performed by the sensor unit 190 exceeds a predefined range (e.g., the difference between electrical properties of first and second peripheries exceeds the predefined range), the distance control unit 160 may control the distance between the electrodes 150 such that the electrical property of the second periphery becomes similar to the electrical property of the first periphery. Here, the predefined range may refer to a range outside which plasma fails to be concentrated upon the substrate due to imbalances in the density of the plasma.

The distance control unit 160 controls the distance between the electrodes 150 such that the electrical property of the second periphery, which is around the focus ring 130 adjacent to the edge of the substrate, becomes similar to the electrical property of the first periphery, which is around the ceramic puck 122 adjacent to the middle of the substrate, so as not for the density of plasma to differ from the edge to the middle of the substrate.

For example, an electrical property sensed by the sensor unit 190 (or a factor affecting the electrical property) may be impedance, and if the impedance of the second periphery is lower than the impedance of the first periphery, the distance control unit 160 may widen the distance between the electrodes 150 to lower the capacitance around the second periphery.

On the contrary, if the impedance of the second periphery is higher than the impedance of the first periphery, the distance control unit 160 may reduce the distance between the electrodes 150 to increase the capacitance around the second periphery.

In other words, the shape and the height of the focus ring 130 may change because the focus ring 130 is etched during an etching process, and not only the height, but also the shape of the focus ring 130 may affect the density of plasma. Therefore, capacitance may be varied based on the difference between the electrical properties of the first and second peripheries by controlling the distance between the electrodes 150 with the distance control unit 160.

The distance control unit 160 may include a support member 161 and a driving member 162.

The support member 161 may be formed of a non-conductive material or a material having a lower electrical conductivity than the electrodes 150 to minimize its electrical influence on the electrodes 150. For example, the support member 161 may be formed of, or coated with, one of a polyethylene material and a Teflon material.

The support member 161 may support the electrodes 150, and the position of the upper end of the support member 161 may be variable. In other words, the height of the support member 161 may be controlled to adjust the height of the second electrode 152 and thus to make the electrical property of the second periphery become similar to the electrical property of the first periphery.

The length of the support member 161 may be changed to control the distance of the second electrode 152 from the first electrode 151. That is, the support member 161 may support the lower end of the second electrode member 152, and the height of the lower end of the second electrode 152 may form the height of the upper end of the support member 161. Accordingly, the height of the second electrode 152 may be changed by controlling the height of the support member 161, and as a result, the distance of the second electrode 152 from the first electrode 151 may be controlled.

The support member 161 may have a predetermined length in a vertical direction to have its height changed. For example, the support member 161 may be provided as a rack gear 161a with a plurality of gear teeth. The support member 161 may be provided with a guide bar 161G to guide the vertical movement of the rack gear 161A and prevent disengagement of the rack gear 161A. The guide bar 161G may be a vertical bar positioned on the opposite side of a pinion gear 162A.

However, the present disclosure is not limited to this. Other exemplary support members will be described later with reference to FIGS. 4 and 5. The distance of the second electrode 162 from the first electrode 151 may also be controlled by changing the volume of the support member 161, and this will be described later with reference to FIGS. 6 and 7.

The driving member 162 may control the height or the volume of the support member 161 to change the position of the upper end of the support member 161. For example, the driving member 162 may include the pinion gear 162A, which engages with the rack gear 161A, and a motor 162M, which transmits a rotational force to the pinion gear 162A. As will be described later with reference to FIGS. 4 through 7, various modifications may be made to the driving member 162.

It will be described how the distance control unit 160 controls the distance between the electrodes 150.

Referring to FIG. 2, the electrodes 150 may be spaced apart by a distance d, in the insulating layer 140. As the focus ring 130 is etched during an etching process, the shape and the height of the focus ring 130 may change.

The impedance of the second periphery, sensed by the sensor unit 190, may be higher than the impedance of the first periphery, sensed by the sensor unit 190. Then, the distance control unit 160 may reduce the distance between the electrodes 150 to increase the capacitance around the second periphery.

That is, referring to FIG. 3, the height of the support member 161 may be increased by the driving member 162 to reduce the distance between the electrodes 150. As a result, the height of the second electrode member 152, which is supported by the support member 151, may be increased, and the distance between the first and second electrodes 151 and 152 may be reduced from the distance d to a distance d', which is less than the distance d. The distance d' may correspond to the height of the second electrode 152 that can make the impedance of the second periphery become similar to the impedance of the first periphery.

If the impedance of the second periphery is lower than the impedance of the first periphery, the height of the support member 161 may be reduced by the driving member 162, and as a result, the distance control unit 160 may increase the distance between the electrodes 150 to lower the capacitance around the second periphery.

The sensor unit 190 may be provided in the chamber 110 and may sense the electrical property in the chamber 110. The sensor unit 190 may sense the electrical property of the first periphery, which is around the ceramic puck 122, and the electrical property of the second periphery, which is around the focus ring 130. The sensor unit 190 may include a first sensor 191, which senses the electrical property of the first periphery, and a second sensor 192, which senses the electrical property of the second periphery.

For example, the electrical property sensed by the sensor unit 190 may include impedance. The sensor unit 190 may be provided as an impedance sensor unit capable of sensing the impedance in the chamber 110. The impedance sensor unit may sense the impedance in the chamber 110.

FIG. 1 illustrates that the sensor unit 190 is electrically connected to the ceramic puck 122 and the focus ring 130. The position of the sensor unit 190 is not particularly limited, and the sensor unit 190 may be provided to sense the surroundings of the upper ends of the ceramic puck 122 and the focus ring 130. In other words, the sensor unit 190 may have various layouts and various connections to other elements to sense the electrical properties of the first and second peripheries.

The plasma generation unit 170 may generate plasma from a gas that remains in a discharge space. The discharge space may refer to the space in the chamber 110 above the substrate support unit 120.

For example, the plasma generation unit 170 may generate plasma in the discharge space in the chamber 110 by using an inductively-coupled plasma (ICP) source. In this example, an antenna unit (not illustrated) may be provided and may be used as an upper electrode.

In another example, the plasma generation unit 170 may generate plasma in the discharge space in the chamber 110 by using a capacitively-coupled plasma (CCP) source. In this example, a shower head unit (not illustrated) may be used as an upper electrode. Various modifications may be made to the plasma generation unit 170 without conflicting with the scope of the present disclosure.

The plasma generation unit 170 may include an upper power source 171, a first transmission line 172, a lower power source 173, and a second transmission line 174 and may apply power to the substrate support unit 120, which forms a lower electrode, and the antenna unit or the shower head unit, which forms an upper electrode. When power is applied to the lower and upper electrodes, the functions of a plasma source may be performed.

The gas supply unit 180 may supply a processing gas into the chamber 110 through, for example, the shower head unit. The gas supply unit 180 may include a gas supply source 181 and a gas supply line 182.

The gas supply source 181 may supply an etching gas for processing the substrate as the processing gas. For example, the gas supply source 181 may supply a fluorine-contained gas (e.g., $SF_6$ or $CF_4$) as the etching gas.

The gas supply line 182 may be connected to the gas supply source 181. The gas supply line 182 may allow the etching gas provided by the gas supply line 181 to be injected into the chamber 110.

In some embodiments, other gas supply lines may be further provided. For example, a deposition gas (e.g., $C_4F_8$ or $C_2F_4$) or a gas for removing any foreign materials remained on the ceramic puck 122 may be provided. That is, various modifications may be made to the gas supply unit 180.

A substrate processing apparatus according to another embodiment of the present disclosure will hereinafter be described with reference to FIGS. 4 and 7. Descriptions of elements or features that have already been described above will be omitted.

FIG. 4 illustrates the inside of an insulating layer of a substrate processing apparatus according to a second embodiment of the present disclosure, and FIG. 5 illustrates how to change the distance between electrodes of FIG. 4. The embodiment of FIGS. 4 and 5 will hereinafter be described, focusing mainly on the differences with the embodiment of FIGS. 2 and 3.

Referring to FIGS. 4 and 5, a substrate processing apparatus 100, like its counterpart of FIGS. 2 and 3, may include a chamber 110, a substrate support unit 120, a focus ring 130, an insulating layer 140, two electrodes 150, a distance control unit 160, a plasma generation unit 170, a gas supply unit 180, and a sensor unit 190.

The distance control unit 160 may include a support member 161 and a driving member 162 and may be provided as, for example, a hydraulic cylinder or a pneumatic cylinder.

The support member 161 may be provided as a piston 161B whose projected length is adjustable. The driving member 162 may be provided as a cylinder 162B, and a fluid (e.g., the air or an oil) may flow into or out of the cylinder 162B to control the projected length of the piston 161B.

In the distance control unit 160 of FIGS. 2 and 3, the height of the upper end of the support member 161 may be formed by the rack gear 161A. On the contrary, in the distance control unit 160 of FIGS. 4 and 5, the projected length of the piston 161B may be controlled. The driving member 162 of the distance control unit 160 of FIGS. 4 and 5, unlike the driving member 162 of the distance control unit 160 of FIGS. 2 and 3, includes the cylinder 162B, but may have the same operating mechanism as, or a similar operating mechanism to, the driving member 162 of the distance control unit 160 of FIGS. 2 and 3.

In other words, referring to FIG. 4, the electrodes 150 in the insulating layer 140 may be spaced apart from each other by a distance d. As the focus ring 130 is etched during an etching process, the shape and the height of the focus ring 130 may change.

As the shape and the height of the focus ring 130 change due to the focus ring 130 being etched, an electrical property (e.g., impedance) of a second periphery, sensed by the sensor unit 190, may be higher than an electrical property (e.g., impedance) of a first periphery, sensed by the sensor unit 190.

Then, referring to FIG. 5, the piston 161B of the distance control unit 160 may reduce the distance between the electrodes 150 by increasing the height of a second electrode 152 to raise the capacitance around the second periphery.

Substrate processing apparatuses according to other embodiments of the present disclosure will hereinafter be described.

FIG. 6 illustrates the inside of an insulating layer of a substrate processing apparatus according to a third embodiment of the present disclosure. FIG. 7 illustrates the inside of an insulating layer of a substrate processing apparatus according to a fourth embodiment of the present disclosure.

The embodiments of FIGS. 6 and 7 will hereinafter be described, focusing mainly on the differences with the embodiments of FIGS. 2 through 5.

Referring to FIG. 6 or 7, a substrate processing apparatus 100, like its counterpart of any one of FIGS. 2 through 5, may include a chamber 110, a substrate support unit 120, a focus ring 130, an insulating layer 140, two electrodes 150, a distance control unit 160, a plasma generation unit 170, a gas supply unit 180, and a sensor unit 190.

The distance control unit 160 may include a support member 161 and a driving member 162. The distance control unit 160, unlike its counterpart of any one of FIGS. 2 through 5, may change its volume, rather than its height.

The embodiments of FIGS. 6 and 7 differ only in the position of the driving member 162 and thus will hereinafter be described, focusing mainly on the difference therebetween.

For example, the support member 161 may include an upper body 161C1 and a lower body 161C2 and may have a structure capable of increasing or reducing the volume of a box structure 161C, which is hollow.

The upper body 161C1, which forms the upper part of the box structure 161C, may form space, and a lower part of the upper body 161C1 may be open. The lower body 161C2, which forms the lower part of the box structure 161C, may surround the circumferential surface of the upper body 161C1, and an upper part of the lower body 161C2 may be open and may thus communicate with the space in the upper body 161C1. Accordingly, the volume of the box structure 161C may increase or decrease in accordance with the amount of a fluid, and as a result, the height of the upper end of the box structure 161C may change.

A ball bearing (not illustrated) and a sealing member (not illustrated) may be provided between the upper and lower bodies 161C1 and 161C2 to allow the lower body 161C1 to be smoothly slidable against the upper body 161C1 and to properly seal the upper and lower bodies 161C1 and 161C2.

As the temperature in the chamber 110 reaches as high as 60° or 100°, the upper and lower bodies 161C1 and 161C2 may be formed of a material whose shape is rarely deformed by high temperature, for example, a Teflon material, but the present disclosure is not limited thereto.

Alternatively, the upper and lower bodies 161C1 and 161C2 may be formed of a silicon material, which is resistant to heat, and may have a structure capable of being folded or unfolded. That is, various modifications may be made to the distance control unit 160 without conflicting with the scope of the present disclosure.

The driving member 162 may include a fluid control member 162C, which supplies a fluid into, or sucks the fluid out of, the support member 161 to increase or reduce the volume of the support member 161. For example, the fluid control member 162C may be formed as a pump or an inert gas supply (e.g., a nitrogen supply).

The driving member 162 may be provided with a pipe and a valve to supply a fluid into the support member 161 and release the fluid from the support member 161. That is, various modifications may be made to the distance control unit 160.

Referring to FIG. 6, the driving member 162 may be connected to a side surface of the lower body 161C2 to supply a fluid into, or release the fluid from, the support member 161 at the side surface of the lower body 161C2.

Alternatively, referring to FIG. 7, the driving member 162 may be provided below the lower body 161C2 and may supply a fluid into, or release the fluid from, the support member 161, from below the lower body 161C2.

When the fluid control member 162C of the driving member 162 supplies a fluid into the support member 161, the volume of the support member 161 may increase, and as a result, the height of the upper end of the support member 161 may increase. On the contrary, when the fluid is released from the support member 161, the volume of the support member 161 may decrease, and as a result, the height of the upper end of the support member 161 may decrease.

The distance between the electrodes 150 may be controlled by controlling the height of the support member 161 in response to the supply or the release of a fluid.

The substrate processing apparatus 100 may include a variable capacitance device. As already mentioned above, the variable capacitance device may include the insulating layer 140, the electrodes 150, the distance control unit 160, and the sensor unit 190.

A substrate processing method using the substrate processing apparatus 100 of any one of FIGS. 1 through 7 will hereinafter be described.

FIG. 8 is a flowchart illustrating a substrate processing method according to some embodiments of the present disclosure.

Referring to FIG. 8, the substrate processing method may include providing a substrate processing apparatus (S110); sensing an electrical property of a first periphery, which is around a ceramic puck, and an electrical property of a second periphery, which is around a focus ring (S120); determining whether the difference between the electrical properties of the first and second peripheries exceeds a predefined range (S130); and controlling the distance between two electrodes to make the electrical property of the second periphery become similar to the electrical property of the first periphery (S140).

First, a substrate processing apparatus 100 is provided (S110).

As already mentioned above, the substrate processing apparatus 100 may include a chamber 110, a substrate support unit 120, a focus ring 130, an insulating layer 140, two electrodes 150, a distance control unit 160, a plasma generation unit 170, a gas supply unit 180, and a sensor unit 190.

Thereafter, the sensor unit 190 may sense an electrical property. For example, the sensor unit 190 may sense the electrical property of the first periphery, which is around a ceramic puck 122, and the electrical property of the second periphery, which is around the focus ring 130 (S120).

Here, the electrical property sensed by the sensor unit 190 may include impedance. As already mentioned above, the sensor unit 190 may be provided as an impedance sensor unit.

Thereafter, a determination may be made as to whether the result of sensing performed by the sensor unit 190 exceeds a predefined range. For example, a determination may be made as to whether the difference between the electrical properties of the first and second peripheries, sensed by the sensor unit 190, exceeds a predefined range (S130).

For example, if the difference between the electrical properties of the first and second peripheries does not exceed the predefined range, the distance between the electrodes 150 may be maintained, and the distance control unit 160 may not perform any particular operation.

On the contrary, if the difference between the electrical properties of the first and second peripheries exceeds the predefined range, the distance between the electrodes 150 may be controlled to make the electrical property of the second periphery become similar to the electrical property of the first periphery (S140).

Here, if the impedance of the second periphery is lower than the impedance of the first periphery, the distance between the electrodes 150 may be widened to lower the capacitance around the second periphery.

On the contrary, if the impedance of the second periphery is higher than the impedance of the first periphery, the distance between the electrodes 150 may be reduced to increase the capacitance around the second periphery.

As already mentioned above, the distance between the electrodes 150 may be controlled by the distance control unit 160, and thus, a detailed description of how the distance control unit 160 controls the distance between the electrodes 150 will be omitted.

According to the embodiments of the present disclosure, any imbalance in the density of plasma in the chamber 110 can be improved by varying capacitance even when the focus ring 130 is etched so that the height and shape of the focus ring 130 change. As a result, the replacement cycle of the focus ring 130 can be reduced, and the yield of semiconductors can be improved.

Also, as capacitance can be varied by controlling the distance between the electrodes 150 in the chamber 110, power lines can be reduced, as compared to the case of performing impedance control outside the chamber 110. As a result, the loss rate and the stability of power lines can be improved.

Although embodiments of the present disclosure have been described in detail, those skilled in the art should understand that they may make various changes, substitutions and alterations herein without departing from the spirit and scope of the present disclosure. Accordingly, the foregoing should be considered as merely exemplary and not as limiting.

What is claimed is:

1. A substrate processing apparatus comprising:
   a chuck member;
   a ceramic puck disposed on the chuck member;
   a focus ring disposed to surround the ceramic puck;
   an insulating layer disposed below the focus ring to surround the chuck member;
   two electrodes formed in the insulating layer, wherein a distance between the two electrodes is adjustable to form a variable capacitance; and
   a sensor unit provided in a chamber where the chuck member is provided, the sensor unit sensing an electrical property in the chamber,
   wherein the sensor unit senses an electrical property of a first periphery which is around the ceramic puck, and an electrical property of a second periphery, which is around the focus ring, and the distance between the two electrodes is controlled such that the electrical properties of the first and second peripheries become similar to each other.

2. The substrate processing apparatus of claim 1, wherein the electrical property sensed by the sensor unit includes impedance,
   if an impedance of the second periphery is lower than an impedance of the first periphery, the distance between the two electrodes is widened to lower capacitance around the second periphery, and
   if the impedance of the second periphery is higher than the impedance of the first periphery, the distance between the two electrodes is reduced to increase capacitance around the second periphery.

3. The substrate processing apparatus of claim 1, wherein the sensor unit includes an impedance sensor, which senses impedance inside the chamber.

4. The substrate processing apparatus of claim 1, further comprising:
   a distance control unit controlling the distance between the two electrodes,
   wherein the distance control unit includes a support member, which supports the two electrodes and an upper end position of which is variable, and a driving member, which controls a height or volume of the support member to change the upper end position of the support member, and controls the height of the support member such that the electrical property of the second periphery becomes similar to the electrical property of the first periphery.

5. The substrate processing apparatus of claim 4, wherein the support member includes a rack gear, which has a length in the vertical direction and is provided with a plurality of gear teeth, and
   the driving member includes a pinion gear, which engages with the rack gear, and a motor, which transmits a rotational force to the pinion gear.

6. The substrate processing apparatus of claim 4, wherein the support member includes a piston whose projected length is adjustable, and
   the driving member includes a cylinder, into which, or out of which, a fluid flows to control the projected length of the piston.

7. The substrate processing apparatus of claim 4, wherein the support member includes an upper body, in which space is formed and which has a lower part opened, and a lower body, which surrounds a circumferential surface of the upper body, has an upper part thereof opened, and communicates with the space of the upper body,
   as a volume of the support member increases or decreases in accordance with an amount of a fluid, a height of an upper end of the support member changes, and
   the driving member includes a fluid control member, which supplies the fluid into, or sucks the fluid out of, the support member to increase or reduce the volume of the support member.

8. The substrate processing apparatus of claim 4, wherein the support member includes a non-conductive material or a material with a lower electrical conductivity than the two electrodes.

9. The substrate processing apparatus of claim 8, wherein the support member is formed of, or coated with, one of a polyethylene material and a Teflon material.

10. The substrate processing apparatus of claim 1, wherein
    the insulating layer is formed of a dielectric material, and space in which the two electrodes are provided is sealed, or a top and a circumferential surface of the space are not exposed, to prevent a polymer from being deposited on the two electrodes.

11. A variable capacitance device comprising:
an insulating layer disposed below a focus ring, in a chamber, to surround a chuck member;
two electrodes formed in the insulating layer, wherein a distance between the two electrodes is adjustable to form a variable capacitance;
a distance control unit including a support member, which supports the electrodes and an upper end position of which is variable, and a driving member, which controls a height or volume of the support member to change the upper end position of the support member, the distance control unit controlling the distance between the two electrodes; and
a sensor unit provided in the chamber and sensing an electrical property of a first periphery, which is around a ceramic puck, and an electrical property of a second periphery, which is around the focus ring,
wherein the distance control unit controls the height of the support member such that the electrical property of the second periphery becomes similar to the electrical property of the first periphery.

12. The variable capacitance device of claim 11, wherein
the support member includes a non-conductive material or a material with a lower electrical conductivity than the two electrodes,
the insulating layer is formed of a dielectric material,
each of the electrical properties sensed by the sensor unit includes impedance,
the sensor unit includes an impedance sensor unit,
if an impedance of the second periphery is lower than an impedance of the first periphery, the distance between the two electrodes is widened to lower capacitance around the second periphery, and
if the impedance of the second periphery is higher than the impedance of the first periphery, the distance between the two electrodes is reduced to increase capacitance around the second periphery.

13. The variable capacitance device of claim 11, wherein
the two electrodes include a first electrode, which is positioned in an upper part of the insulating layer, and a second electrode, which is provided below the first electrode member to be movable in a vertical direction, and
the support member supports the second electrode and controls a distance of the second electrode from the first electrode via a change in the length or volume thereof.

14. The variable capacitance device of claim 11, wherein
the support member includes a rack gear, which has a length in the vertical direction and is provided with a plurality of gear teeth, and
the driving member includes a pinion gear, which engages with the rack gear, and a motor, which transmits a rotational force to the pinion gear.

15. The variable capacitance device of claim 11, wherein
the support member includes a piston whose projected length is adjustable, and
the driving member includes a cylinder, into which, or out of which, a fluid flows to control the projected length of the piston.

16. A substrate processing method comprising:
providing a substrate processing apparatus including a chuck member, a chuck member, a ceramic puck, which is disposed on the chuck member, a focus ring, which is disposed to surround the ceramic puck, an insulating layer, which is disposed below the focus ring to surround the chuck member, two electrodes, which are formed in the insulating layer and a distance between which is adjustable to form a variable capacitance, and a sensor unit, which is provided in a chamber where the chuck member is provided and senses an electrical property in the chamber;
sensing, by the sensor unit, an electrical property of a first periphery, which is around the ceramic puck, and an electrical property of a second periphery, which is around the focus ring; and
controlling the distance between the two electrodes such that the electrical properties of the first and second peripheries become similar to each other.

17. The substrate processing method of claim 16, wherein
the sensing the electrical properties of the first and second peripheries, comprises sensing, by the sensor unit, impedances of the first and second peripheries, and
the controlling the distance between the two electrodes, comprises widening the distance between the two electrodes if the impedance of the second periphery is lower than the impedance of the first periphery, and reducing the distance between the two electrodes if the impedance of the second periphery is higher than the impedance of the first periphery.

\* \* \* \* \*